United States Patent
Engelhardt et al.

(10) Patent No.: US 6,716,643 B1
(45) Date of Patent: Apr. 6, 2004

(54) METHOD FOR PRODUCING A SEMICONDUCTOR MEMORY ELEMENT

(75) Inventors: Manfred Engelhardt, Feldkirchen-Westerham (DE); Volker Weinrich, Paris (DE)

(73) Assignee: Infineon Technologies AG, Munich (DE)

( * ) Notice: Subject to any disclaimer, the term of this patent is extended or adjusted under 35 U.S.C. 154(b) by 21 days.

(21) Appl. No.: 10/048,192
(22) PCT Filed: Jul. 27, 2000
(86) PCT No.: PCT/DE00/02555
§ 371 (c)(1), (2), (4) Date: Jun. 3, 2002
(87) PCT Pub. No.: WO01/08215
PCT Pub. Date: Feb. 1, 2001

(30) Foreign Application Priority Data

Jul. 27, 1999 (DE) .......................... 199 35 130

(51) Int. Cl.⁷ .................................. H01G 7/06
(52) U.S. Cl. ..................... 438/3; 438/240; 438/253
(58) Field of Search ............................ 438/3

(56) References Cited

U.S. PATENT DOCUMENTS

| | | | | |
|---|---|---|---|---|
| 5,478,768 A | | 12/1995 | Iwasa ........................ | 437/52 |
| 5,723,374 A | * | 3/1998 | Huang et al. ............... | 438/253 |
| 5,780,338 A | * | 7/1998 | Jeng et al. .................. | 438/253 |
| 5,814,527 A | * | 9/1998 | Wolstenholme et al. ...... | 438/5 |
| 5,914,851 A | | 6/1999 | Saenger et al. ............. | 361/311 |
| 6,030,900 A | | 2/2000 | Grassl et al. ............... | 438/700 |
| 6,097,052 A | | 8/2000 | Tanaka et al. | |
| 6,124,165 A | * | 9/2000 | Lien .......................... | 438/253 |

FOREIGN PATENT DOCUMENTS

| | | | |
|---|---|---|---|
| DE | 19640211 | 4/1998 | |
| JP | 07-240389 | 9/1995 | ........... H01L/21/28 |
| WO | WO 97/06556 | 2/1997 | ......... H01L/21/316 |

OTHER PUBLICATIONS

International Search Report (WIPO).

* cited by examiner

*Primary Examiner*—H. Jey Tsai
(74) *Attorney, Agent, or Firm*—Fish & Richardson P.C.

(57) ABSTRACT

A method for fabricating a contact hole for a semiconductor memory element. The memory element includes a silicon substrate, an intermediate dielectric layer on the substrate, and an upper layer on the intermediate dielectric layer. The method includes forming a perforated mask on the upper layer, the mask including a material that exhibits temperature stability. The upper layer and a depression are etched into the intermediate dielectric layer as far as a residual thickness using the perforated mask. A layer including $O_3/TEOS\text{-}SiO_2$ is deposited onto a structure thus obtained. The layer including $O_3/TEOS\text{-}SiO_2$ is removed from a bottom of the depression by etching. The depression is lowered by etching to produce the contact hole as far as an interface with the silicon substrate, the silicon substrate being uncovered, and the layer including $O_3/TEOS\text{-}SiO_2$ serving as a lateral seal of the upper layer during the lowering of the depression.

4 Claims, 2 Drawing Sheets

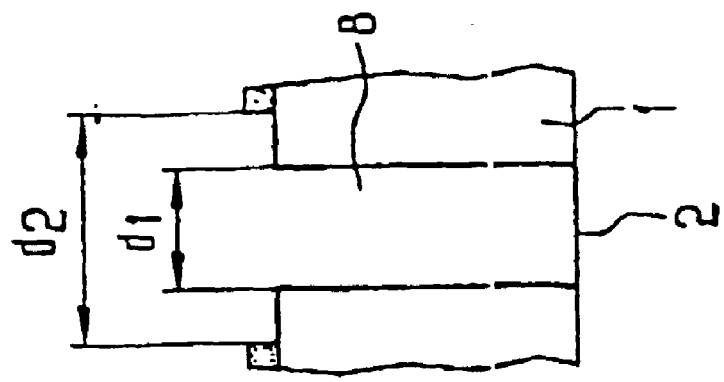
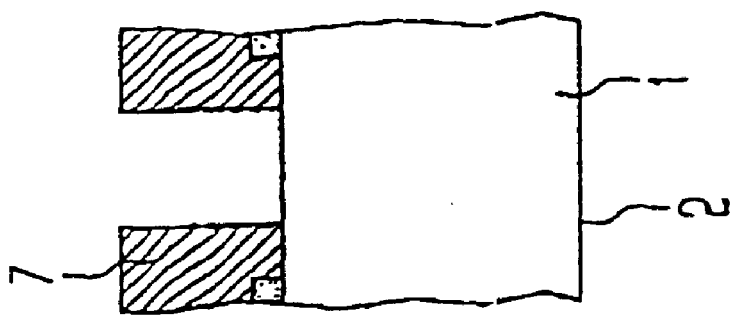
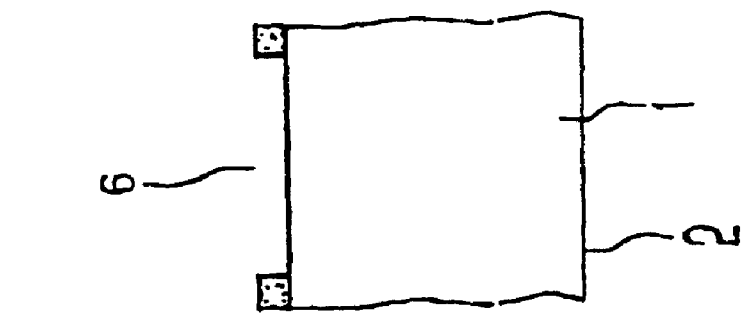
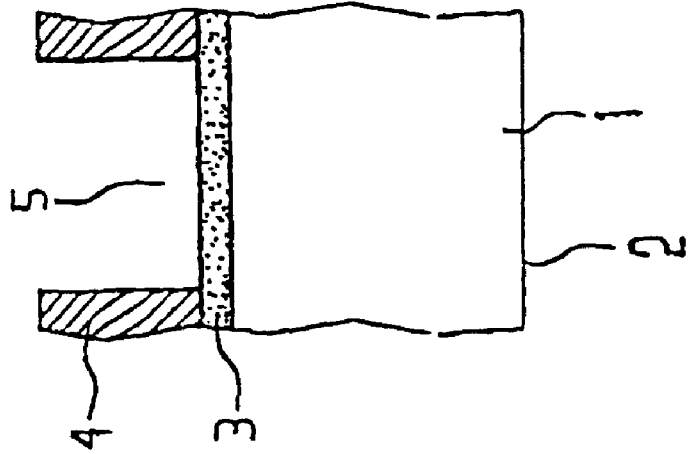

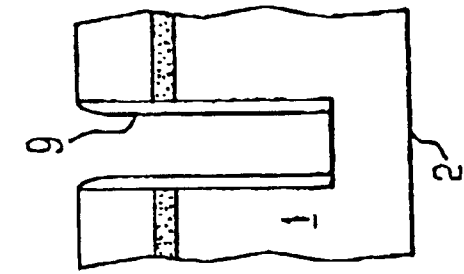
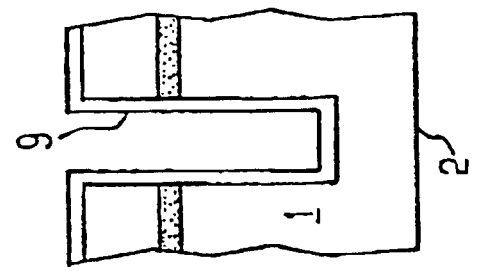
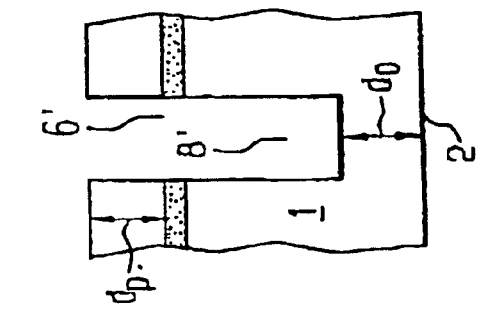
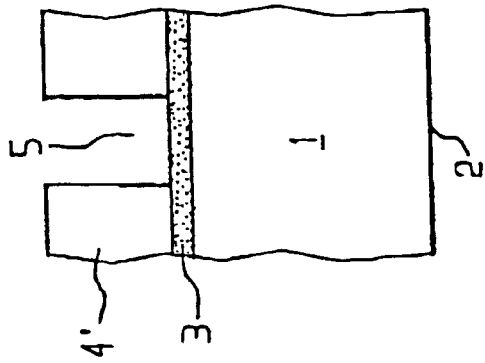
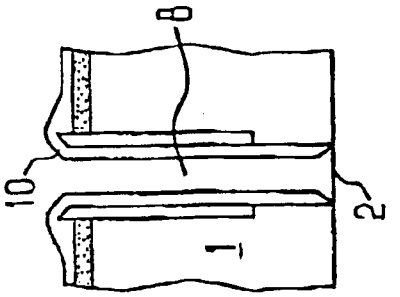
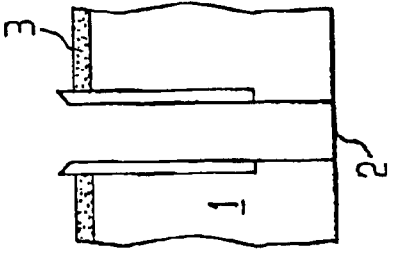
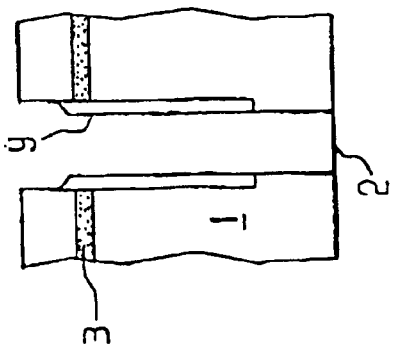

METHOD FOR PRODUCING A SEMICONDUCTOR MEMORY ELEMENT

The invention relates to a method for fabricating a contact hole for a semiconductor memory component, in particular a DRAM or an FRAM, having a silicon substrate, an intermediate dielectric layer arranged on said substrate, an upper layer made of a ferroelectric material or made of a material having a high dielectric constant being arranged on said intermediate dielectric layer.

Depending on the chip design or the chip layout, it is necessary, in a large scale integrated DRAM or FRAM, when using materials having a high dielectric constant, for example BST (BST stands for Barium Strontium Titanate), and ferroelectric materials, for example SBT (SBT stands for Strontium Bismuth Tantalate), to etch through these materials during the plasma etching of the contact hole to the silicon substrate. In this case, contamination of the monocrystalline silicon substrate which is uncovered at the bottom of the contact hole must be avoided in order to prevent an adverse effect on the selection transistor of DRAM or FRAM.

For this purpose, it is known to carry out two lithography process steps or two lithography levels. In this case, in the first lithography process step, a window is produced in the ferroelectric layer by plasma etching using a resist mask. In the second lithography process step, the actual contact hole is thereupon etched down to the silicon substrate using a new, smaller resist mask. Although this conventional method leads to the aim of avoiding contamination of the bottom of the contact hole, it is nonetheless very complex on account of the use of two lithography process steps or lithography levels.

DE 43 40 419 C2 discloses a method for fabricating a semiconductor device having an insulating layer in which a contact hole is formed. In this known method, a photoresist perforated mask is formed on the insulating layer and anisotropic etching is carried out to form part of the contact hole whilst leaving a residual layer thickness of the insulating layer. Furthermore, the photoresist mask is removed and a TEOS layer is deposited on the resulting structure. The TEOS layer is then etched anisotropically in order to remove the TEOS layer at the bottom of the partial contact hole. Afterward, the contact hole is completed by means of an etching process, the contact hole having a configuration in which the opening diameter increases through the upward direction.

DE 195 28 746 C1 discloses a method for producing a silicon dioxide layer on surface sections of a structure with sidewall sections and a bottom section.

Accordingly, an object of the present invention consists in providing a method of the type mentioned in the introduction which leads to the aim with a simplified, i.e. a single, lithography process.

This object is achieved by the subject matter of claim 1. Advantageous developments of the invention are specified in the subclaims.

In other words, the method according to the invention is based on the use of an, organic mask layer which is stable at high temperatures, preferably made of polyimide or photoimide and on the partial etching of the dielectric material layer (intermediate oxide) in combination with the etching-through of the overlying layer made of the material having a high dielectric constant or the ferroelectric material. A depression is thereby achieved in the dielectric layer, except for a residual layer thickness which is less than or equal to the residual thickness of the mask layer after the etching step.

According to the invention, the depression is thereupon sealed laterally by conformal deposition of a layer made of $O_3$/TEOS-$SiO_2$ (TEOS stands for tetraethyl orthosilicate). The process temperature required in this case is typically 400° C. and is tolerated by the perforated mask layer which is stable at high temperatures, without degradation effects.

An oxide etching thereupon uncovers the bottom of the depression in a manner similar to that in the case of a spacer etching, said bottom thereupon being lowered down to the bottom of the contact hole by etching.

The organic layer furthermore serves as a perforated mask and is subsequently removed.

This is advantageously followed by selective renewed deposition of $O_3$/TEOS-$SiO_2$ for the purpose of sealing exclusively the lateral wall of the contact hole and the surface of the wafer, with the bottom of the contact hole being spared. This is followed, in a manner known per se, by contact hole aftertreatment for removing silicon substrate material that is possibly damaged, and metallization of the contact hole.

The method according to the invention thus proceeds more simply than the conventional method with regard to the lithography process.

The invention is explained in more detail below by way of example using exemplary embodiments with reference to the drawings.

In the figures:

FIGS. 1A to 1D diagrammatically show the sequence of steps of a conventional method for fabricating a semiconductor memory component using materials having a high dielectric constant and ferroelectric materials, and FIGS. 2A to 2G diagrammatically show the sequence of steps of a method according to the invention for fabricating a semiconductor memory component using materials having a high dielectric constant and ferroelectric materials.

In order to provide a better understanding of the invention; firstly an explanation will be given, with reference to FIGS. 1A to 1D, of a conventional method for fabricating a semiconductor memory component using materials having a high dielectric constant and ferroelectric materials. This conventional method requires the use of two lithography levels or lithography steps.

The first lithography level is shown in FIGS. 1A and 1B, and the second lithography level is shown in FIGS. 1C and 1D. In accordance with these figures, the semiconductor memory element is constructed from a silicon substrate 11, whose exact structure is not shown, and on which a dielectric layer 1 is arranged, the underside of which adjoins the top side of the silicon substrate 11. This boundary layer is designated generally by the reference numeral 2 in FIGS. 1A to 1D.

The top side of the dielectric layer 1 is adjoined by a continuous layer—in FIG. 1A—having a high dielectric constant (or a ferroelectric layer), which is generally designated by the reference numeral 3. The layer 3 is composed, for example, of BST (BST stands for Barium Strontium Titanate). A ferroelectric layer 3, by contrast, is composed, for example, of SBT (SBT stands for Strontium Bismuth Tantalate).

The top side of the layer 3 having a high dielectric constant is firstly covered completely by a resist layer 4. This resist layer 4 is converted, in a known manner, into a resist mask (perforated mask 4) having a multiplicity of openings 5. The opening 5 serves for etching a window 6 into the layer 3 having a high dielectric constant, as shown in FIG. 1B, which already shows the result of the next method step resulting in the removal of the resist layer 4. This resist removal step is also known as resist stripping.

As shown in FIG. 1C, a resist layer is again applied to the surface structure of FIG. 1B, which resist layer is generally designated by the reference numeral 7 and is converted, in a known manner, into a resist mask having perforations at the locations at which a contact hole is intended to be introduced into the dielectric layer 1. This contact hole is produced by means of the second lithography level by etching the dielectric layer 1 with the aid of the resist mask as far as the boundary layer 2, as shown in FIG. 1D, which already illustrates the result of the next step according to which the resist layer 7 is completely removed.

The etching steps explained above usually involve plasma etching.

The contact hole, which is generally designated by the reference numeral 8, has a typical structural size or a diameter $d_1$ of 0.6 $\mu$m and is thus approximately half as large as the window 6 having the diameter $d_2$. These dimensions are not obligatory, however, but rather are chosen only by way of example.

What is achieved by the method steps expressed in FIGS. 1A to 1D is that the bottom of the contact hole 8 (FIG. 1D), i.e. that surface of the monocrystalline silicon substrate (boundary area 2) which is uncovered by this contact hole, is not contaminated. In the case of a direct etching (i.e. when using a single lithography mask) as far as the Si, the plasma would be contaminated, and thus so, too, would the monocrystalline silicon substrate. In order to prevent an adverse effect on the functioning of the semiconductor memory component, the silicon substrate must not be contaminated.

The method according to the invention for fabricating the semiconductor memory component under discussion will now be explained with reference to FIGS. 2A to 2G. The method according to the invention differs from the method explained above with reference to FIGS. 1A to 1D by the fact that one lithography level or one lithography step is obviated. Accordingly, the method according to the invention is based on a single lithography level.

Insofar as the structure shown in FIGS. 2A to 2G corresponds to that of FIGS. 1A to 1D, the same reference numerals are used.

FIG. 2A corresponds to FIG. 1A with the difference that, in the method step shown in FIG. 2A, a mask made of conventional resist is not used, rather a mask—generally designated by 4'—made of an organic material, such as, for instance, polyimide or photoimide, is used, the mask material being stable relative to a layer made of $O_3$/TEOS-SiO$_2$ which is deposited in the later method step in accordance with FIG. 2C.

The method step shown in FIG. 2A is followed by the method step shown in FIG. 2B, which, using the opening 5, implements the etching both of the layer 3 having a high dielectric constant and of a depression 8' into the dielectric layer 1, which can also be referred to as partial etching in the sense of the contact hole 6 of FIG. 1E. In the etching step shown in FIG. 2B, the mask aver 4' is additionally removed to an extent such that a mask layer thickness $d_p$ remains, which is greater than the residual thickness $d_0$ between the bottom of the depression 8' and the interface 2 with the silicon substrate. For the subsequent process steps, it is essential that the perforated mask residual thickness $d_p$ be greater than or equal to the dielectric residual thickness $d_0$: $d_p \geq d_0$. However, this last is not absolutely necessary, but rather only by way of example. What is essential is that the selectivity of the subsequent etching step allows $d_0$ to be etched with a mask of thickness $d_p$.

In the next process step, shown in FIG. 2C, a layer made of $O_3$/TEOS-SiO$_2$ is deposited onto the structure of FIG. 2B in a highly conformal manner, which layer also lines the depression 8'. This layer is designated by the reference numeral 9. The purpose of the layer 9 is to laterally seal the layer 3 having a high dielectric constant in the region 6' and the dielectric layer 1 in the region of the depression walls. The process temperature during the deposition of the layer 9 is typically 400° C. and is tolerated by the layer 4' which is stable at high temperatures, without degradation effects.

As illustrated in FIG. 2D, the next process step that follows is renewed etching similar to that in the case of a spacer etching for the purpose of uncovering the top side of the perforated mask layer 4' and also the bottom of the depression 8'. The upper edge of the hole in the layer 4' is also shortened during this etching process. As shown in FIG. 2E this etching process is continued until the bottom of the depression 8' has reached the interface 2 with the silicon substrate. Afterward, as shown in FIG. 2F, the layer 4' is removed (stripping).

Afterward, $O_3$/TEOS-SiGO$_2$ is deposited selectively again, as is shown in FIG. 2G and designated by the reference numeral 10. This selective $O_3$/TEOS-SiO$_2$ deposition is explained in detail in German Patent No. 19 528 746, according to which exclusively the top side of the layer 3 having a high dielectric constant and the side wall of the contact hole 8 are coated, whereas no deposition whatsoever is effected at the bottom of the contact hole 8. This is followed by a process step (not illustrated) according to which the contact hole 8 is subjected to an aftertreatment in order to remove possibly damaged material of the silicon substrate at the bottom of the contact hole and to metallize the contact hole.

The method according to the invention as shown in FIGS. 2A to 2G accordingly allows, in a single lithography level, the introduction of a contact hole without contamination of the monocrystalline silicon substrate at the bottom of the contact hole.

What is claimed is:

1. A method for fabricating a contact hole for a semiconductor memory component, having a silicon substrate, an intermediate dielectric layer arranged on said substrate, and an upper layer arranged on said intermediate dielectric layer, said upper layer being made of a material selected from the group consisting of a ferroelectric material and a material having a high dielectric constant the method comprising:

forming a perforated mask on the upper layer, the mask including a material which exhibits temperature stability during a later deposition process;

etching the upper layer and a depression into the intermediate dielectric layer as far as a residual thickness using the perforated mask;

depositing a layer including $O_3$/TEOS-SiO$_2$ onto a structure thus obtained including the perforated mask;

removing the layer including $O_3$MEOS-SiO$_2$ from a bottom of the depression by etching; and thereupon lowering the depression by etching in order to produce the contact hole as far as an interface with the silicon substrate, the silicon substrate being uncovered, the layer including $O_3$/TEOS-SiO$_2$ serving as a lateral seal of the upper layer during the lowering of the depression;

after the uncovering of the silicon substrate at the bottom of the contact hole, the silicon substrate being spared, depositing a second layer including $O_3$/TEOS-SiO$_2$ into the second hole and onto a top surface proximate to the contact hole;

wherein the perforated mask material is stripped prior to deposition of the second layer including $O_3$/TEOS-SiO$_2$.

2. The method as claimed in claim 1, wherein forming the perforated mask comprises forming a perforated mask including polyimide.

3. The method as claimed in claim 1, wherein forming the perforated mask comprises forming a perforated mask including photoimide.

4. The method of claim 1, wherein said upper layer comprises of a material from the group consisting of strontium bismuth tantalate, PZT, and barium strontium titanate.

* * * * *